(12) United States Patent
Chen et al.

(10) Patent No.: US 9,553,001 B2
(45) Date of Patent: Jan. 24, 2017

(54) METHOD OF FORMING A MOLDING LAYER FOR SEMICONDUCTOR PACKAGE

(71) Applicant: TAIWAN SEMICONDUCTOR MANUFACTURING CO., LTD., Hsinchu (TW)

(72) Inventors: Hsien-Wei Chen, Hsinchu (TW); Jie Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/698,694

(22) Filed: Apr. 28, 2015

(65) Prior Publication Data

US 2016/0322238 A1  Nov. 3, 2016

(51) Int. Cl.
*H01L 21/00* (2006.01)
*H01L 21/56* (2006.01)
*H01L 23/48* (2006.01)
*H01L 23/00* (2006.01)
*H01L 25/00* (2006.01)
*H01L 25/065* (2006.01)
*H01L 21/683* (2006.01)

(52) U.S. Cl.
CPC .......... *H01L 21/565* (2013.01); *H01L 21/568* (2013.01); *H01L 21/6835* (2013.01); *H01L 23/481* (2013.01); *H01L 24/11* (2013.01); *H01L 25/0657* (2013.01); *H01L 25/50* (2013.01); *H01L 2221/68359* (2013.01); *H01L 2224/11002* (2013.01); *H01L 2225/06513* (2013.01); *H01L 2225/06548* (2013.01)

(58) Field of Classification Search
CPC .......... H01L 21/56; H01L 21/68; H01L 21/00; H01L 23/48; H01L 23/52
USPC .......... 438/618, 106–109; 257/777, 723, 724
See application file for complete search history.

(56) References Cited

U.S. PATENT DOCUMENTS 6,169,328 B1 *  1/2001  Mitchell .......... H01L 23/4985
                                                  257/675
6,633,081 B2 * 10/2003  Sahara ............ H01L 23/3114
                                                  257/738
6,660,626 B1 * 12/2003  Lin .................. H01L 23/4985
                                                  257/E21.509
7,354,798 B2 *  4/2008  Pogge .............. H01L 21/6835
                                                  257/E21.597
7,776,653 B2    8/2010  Walter et al.
(Continued)

FOREIGN PATENT DOCUMENTS

TW          200802784 A       1/2008

OTHER PUBLICATIONS

Pending U.S. Appl. No. 14/632,371, filed Feb. 26, 2015.

*Primary Examiner* — Yuanda Zhang
*Assistant Examiner* — Sheikh Maruf
(74) *Attorney, Agent, or Firm* — Maschoff Brennan

(57) ABSTRACT

A method of forming a molding layer includes the following operations: forming a substrate having at least one column structure thereon; flipping over the substrate having the column structure such that the column structure is beneath the substrate; dipping the column structure of the flipped substrate into a molding material fluid contained in a container; and separating the column structure of the flipped substrate from the container to form a molding layer covering and in contact with the column structure.

17 Claims, 16 Drawing Sheets

(56) References Cited

U.S. PATENT DOCUMENTS

| | | | | |
|---|---|---|---|---|
| 2004/0028875 A1* | 2/2004 | Van Rijn | A61L 27/50 | 428/98 |
| 2007/0138916 A1* | 6/2007 | Koyama | H03H 9/0542 | 310/348 |
| 2011/0189440 A1* | 8/2011 | Appleby | B22C 9/04 | 428/156 |
| 2011/0227219 A1* | 9/2011 | Alvarado | H01L 24/03 | 257/738 |
| 2011/0230012 A1* | 9/2011 | Hsu | H01L 21/563 | 438/108 |
| 2012/0302008 A1* | 11/2012 | Huang | H01L 21/561 | 438/113 |
| 2014/0138808 A1* | 5/2014 | Dimaano, Jr. | H01L 21/56 | 257/668 |
| 2014/0353838 A1* | 12/2014 | Lin | H01L 24/97 | 257/773 |
| 2015/0115470 A1* | 4/2015 | Su | H01L 23/5384 | 257/774 |
| 2015/0187607 A1* | 7/2015 | Huang | H01L 21/565 | 438/126 |
| 2015/0270232 A1* | 9/2015 | Chen | H01L 24/02 | 257/691 |

* cited by examiner

METHOD OF FORMING A MOLDING LAYER FOR SEMICONDUCTOR PACKAGE

BACKGROUND

The semiconductor integrated circuit (IC) industry has experienced rapid growth. Technological progress in IC manufacture has produced several generations of ICs, and each generation fabricates smaller and more complex circuits than the previous generation. Various types of semiconductor devices performing different functions are integrated and packaged into a single assembly or package. As the demand for miniaturization, higher speed and lower power consumption, there has grown a need for smaller packaging techniques of semiconductor dies. However, as features such as vertical plugs scaling down continues, conventional packaging techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
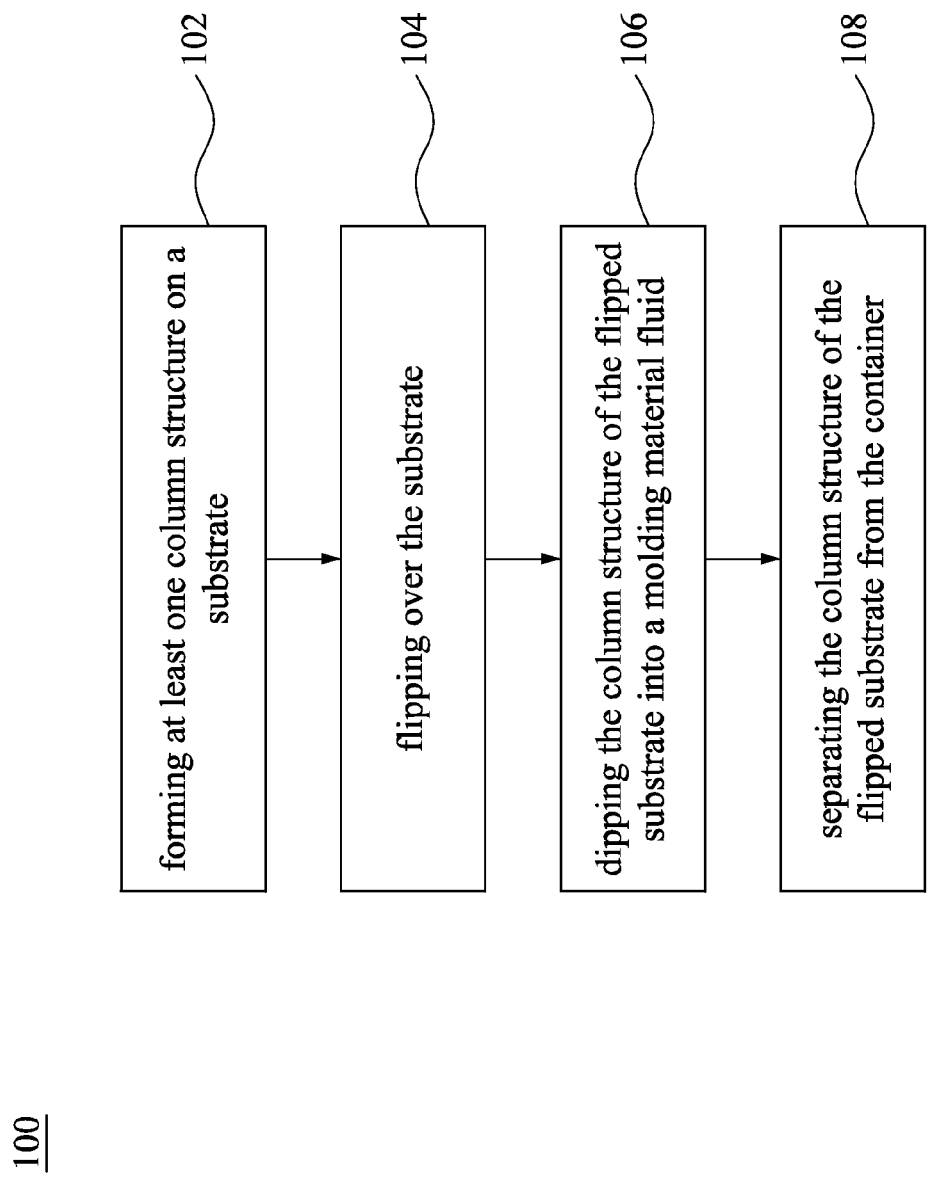
FIG. 1 is a flow chart illustrating a method of forming a molding layer according to various embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure relates generally to a method of forming a molding layer, specifically a molding layer for a semiconductor device. In general, the molding layer is used to cover a conductive via structure and/or semiconductor chips on a substrate. Various embodiments of the present disclosure will be described in detail hereinafter.

Conventionally, the molding layer is formed by dispensing molding material on a substrate, and followed by a molding process and a curing process. However, when the height/width ratio of the spacing between the conductive vias is greater than, for example, approximately 3 or more, the conventional method of forming the molding layer has problem in that the spacing between the conductive via-plugs can not be fully filled, and therefore voids appears in the spacing. These voids may narrow the process window or margin in the following process, and unfavorably lead to reliable issues of semiconductor packages.

FIG. 1 is a flow chart illustrating a method 100 of forming a molding layer according to various embodiment of the present disclosure. The method 100 includes operation 102, operation 104, operation 106 and operation 108. FIGS. 2-16 collectively illustrate more detailed manufacturing methods as a series of cross-sectional views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
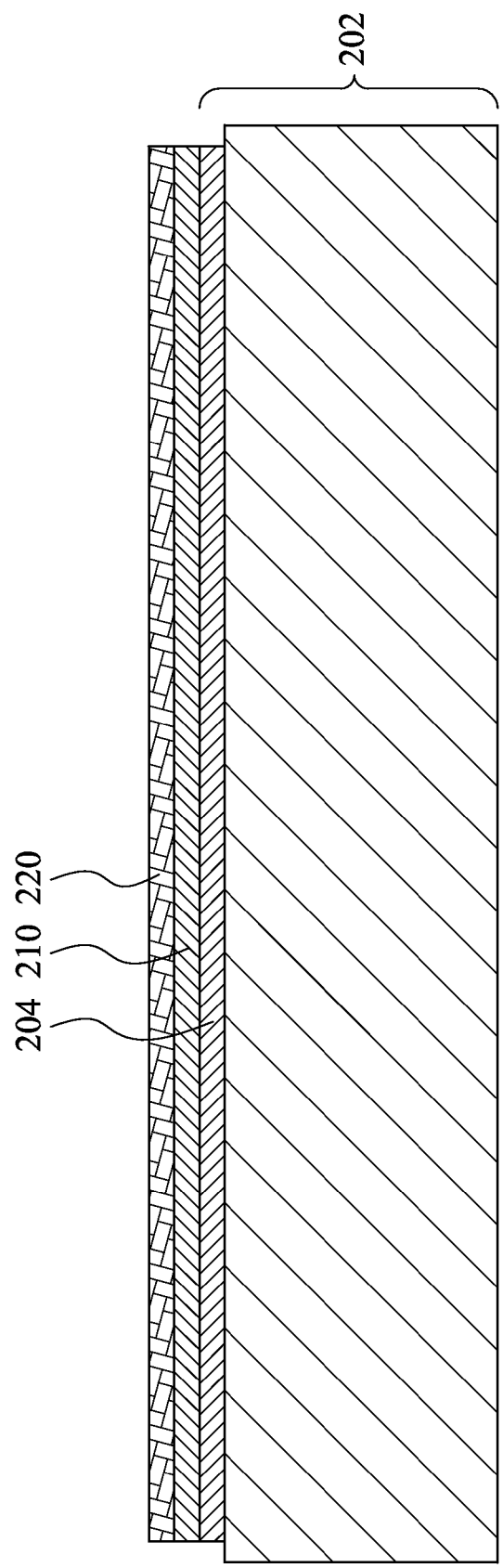
FIGS. 2-16 collectively illustrate manufacturing methods as a series of cross-sectional views in accordance with various embodiments of the present disclosure.
Figure 3:
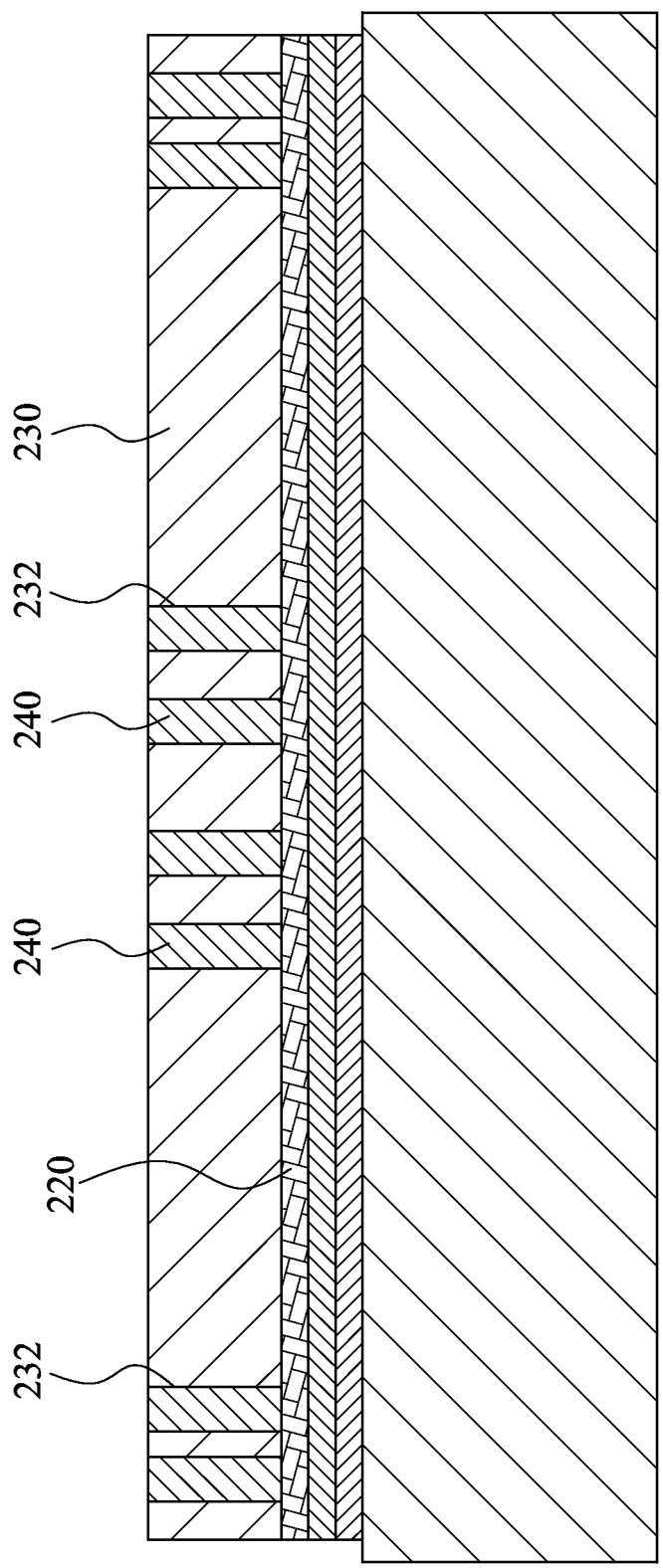
Figure 4:
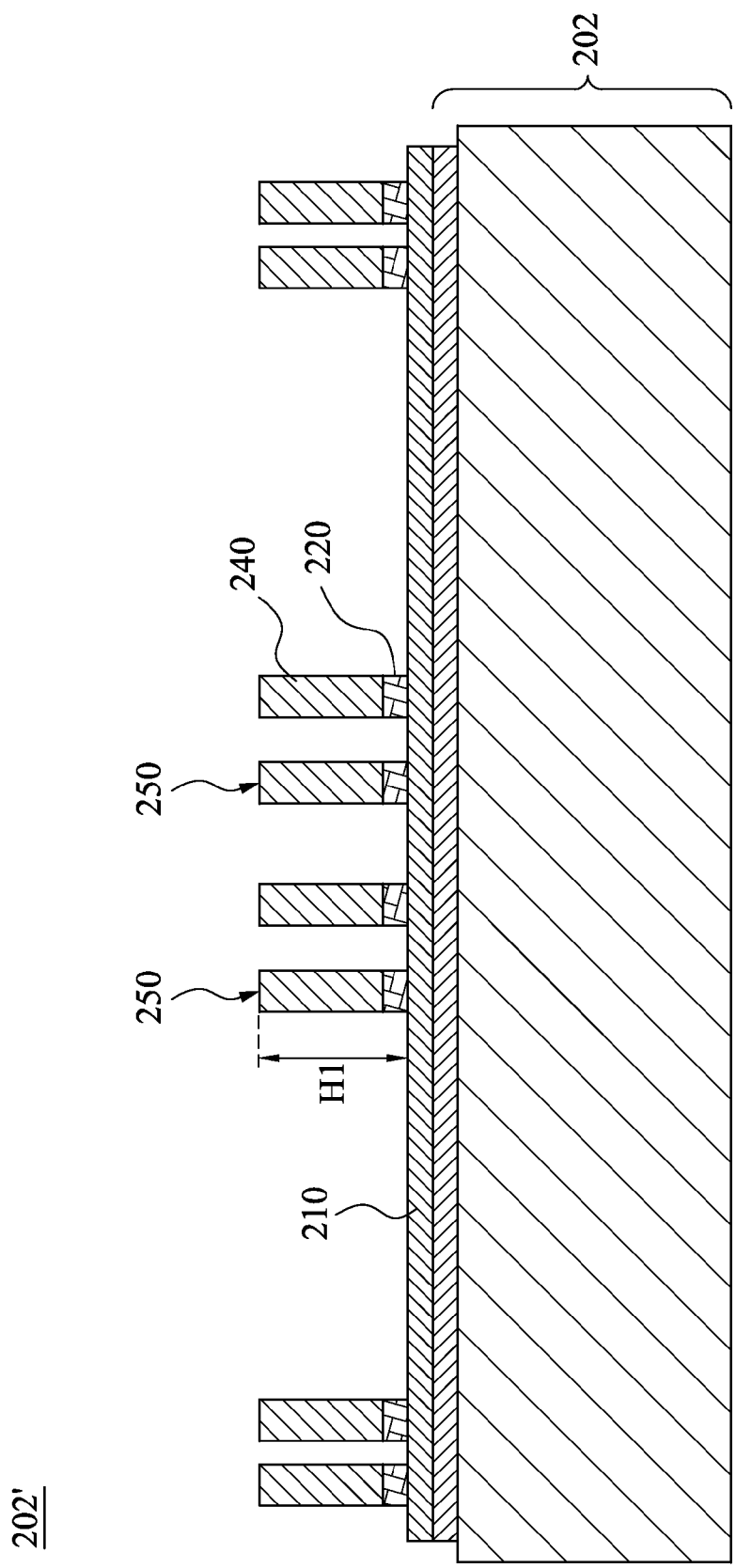

In operation 102, one or more column structures are formed on a substrate. FIGS. 2-4 depict cross-sectional views at various fabrication stages in the operation 102 according to some embodiments of the present disclosure. It should be noted that the fabrication stages as well as the features in connection with FIGS. 2-4 are merely an example. A person skilled in the art will recognize there may be many alternatives, variations and modifications.

In FIG. 2, a dielectric layer 210 is formed over a substrate 202. In some embodiments, the substrate 202 includes a de-bounding layer 204, on which the dielectric layer 210 is deposited. The de-bounding layer 204 may regulate the interface adhesion between the dielectric layer 210 and the de-bounding layer 204, such that the dielectric layer 210 is possibly separated from the de-bounding layer 204 in the following processes in accordance with some embodiments of the present disclosure. The dielectric layer 210 may include polybenzoxazole (PBO), polyimide, benzocyclobutene (BCB), phosphosilicate glass (PSG), borosilicate glass (BSG), boron-doped phosphosilicate glass (BPSG), silicon nitride, silicon oxide, any combinations thereof and/or the like. The dielectric layer 210 may be formed by many suitable approaches such as spinning coating, chemical vapor deposition (CVD), and plasma enhanced CVD (PECVD) and/or the like. In addition, the substrate 202 may be alternatively referred to as a carrier substrate 202 in the some embodiments of the present description. In some examples, the substrate 202 may include a silicon wafer, a glass substrate, or other suitable substrate formed of ceramic material, organic material, group IV and/or group V elements such as silicon, germanium, gallium, arsenic, and combinations thereof. The substrate 202 may include a bulk substrate or a silicon-on-insulator (SOI) substrate.

A conductive layer 220 is thereafter formed over the dielectric layer 210, as illustrated in FIG. 2. The conductive layer 220 may include a seeding layer and/or an under-bump metal (UBM) layer. In some embodiments, the UBM layer may include multiple layers having an adhesion layer and a wetting layer. The adhesion layer may be formed of a material such as for example titanium (Ti), chromium (Cr), titanium-tungsten (TiW) or the like. The wetting layer may be formed of such as for example nickel (Ni) and Cu, and the like. Further, in some embodiments, the seeding layer may include titanium (Ti), copper (Cu), the like, or a combination thereof.

In FIG. 3, a mask layer 230 having a plurality of openings 232 is formed over the conductive layer 220. The opening 232 pass through the mask layer 230, and expose portions of the conductive layer 220 there under. The mask layer 230, for example, may be a photoresist layer fabricated by photolithographic techniques. In some embodiments, the mask layer 230 has a thickness of about 30 μm to about 300 μm, specifically about 50 μm to about 280 μm, more specifically about 100 μm to about 250 μm.

Subsequently, a conductive structure 240 is formed to fill the openings 232 of the mask layer 230, and in contact with the conductive layer 220, as illustrated in FIG. 3. The conductive structure 240, for example, may be formed by electroplating operations, electroless plating operations, physical vapor deposition (PVD), electron beam physical vapor deposition (EBPVD) or other suitable techniques. The conductive structure 240 may includes a material such as for example copper, aluminum, lead, tungsten, the like, or a combination thereof.

In FIG. 4, the mask layer 230 is removed from the conductive layer 220 to expose a portion of the conductive layer 220, and thereby forming one or more column structures 250 standing over the substrate. In other words, a substrate 202' having at least one column structure 250 thereon is formed. In some embodiments, the exposed portion of the conductive layer 220 is further removed so to form the column structures 250, which include the conductive structure 240 and the remained portion of the conductive layer 220, as illustrated in FIG. 4. In addition, a part of the dielectric layer 210 is exposed out when removing the conductive layer 220. The mask layer 230 may be removed by any suitable operation such as for example an ash process, a stripping process and/or flush process. In some embodiments, the column structures 250 constitute through-molding-via (TMV) structures in the following operations.

Figure 5:
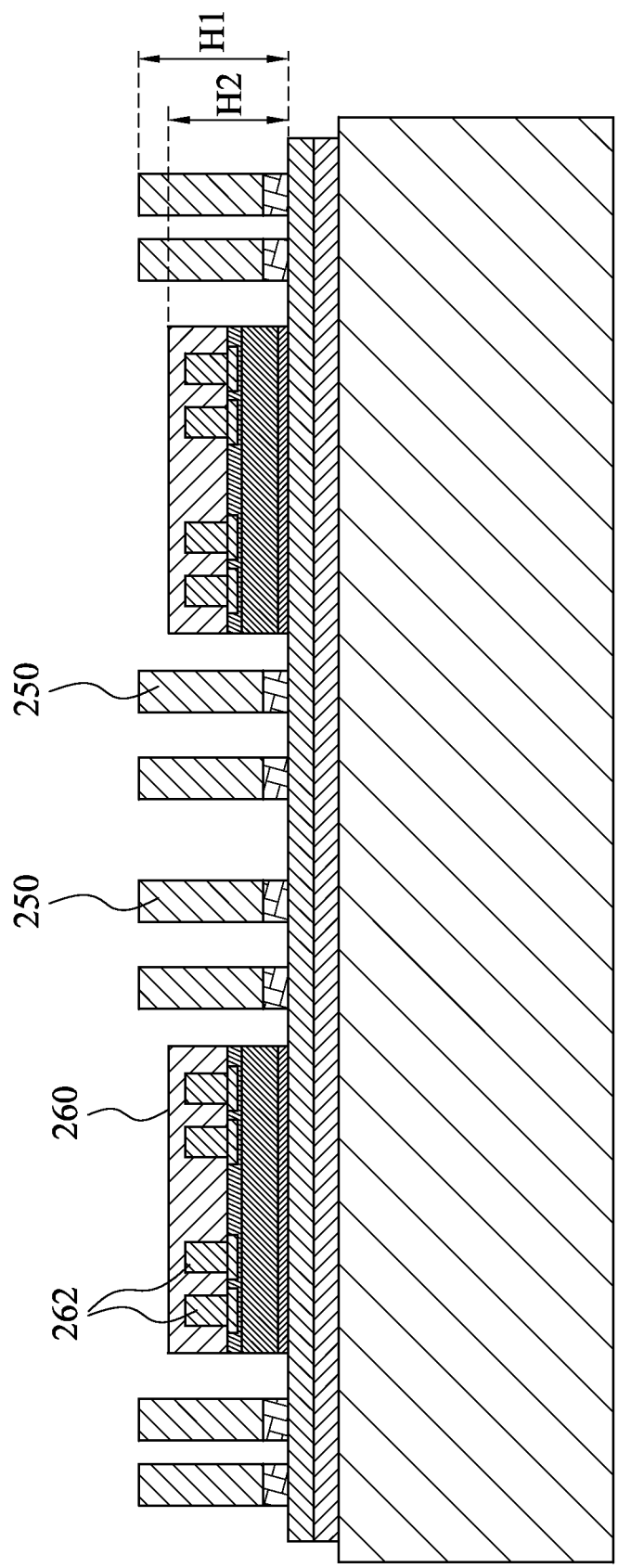

In some embodiments, as shown in FIG. 5, a semiconductor die 260 is attached on the dielectric layer 210. The semiconductor die 260 may include a plurality of pads 262 and certain basic semiconductor layers such as substrate layers, active circuit layers, ILD layers and IMD layers (not shown respectively in FIG. 5). In some examples, the pads 262 are positioned at a level between the dielectric layer 210 and the top surface of column structures 250. The semiconductor die 260 may include various devices such as transistors, capacitors, resistors, diodes, photo-diodes, and/or other desired devices. The devices in the semiconductor die 260 may be interconnected to perform one or more functions such as for example memory, amplifiers, power distribution, sensors, input/output circuitry or the like. One of ordinary skill in the art will appreciate that the above examples are provided for illustrative purposes only, and are not meant to limit the present disclosure in any manner.

In some example, the column structures 250 formed over the substrate 202 has a height H1 of about 30 μm to about 300 μm, specifically about 50 μm to about 250 μm, more specifically about 60 μm to about 200 μm. In yet some examples, the height H1 of the column structures 250 is higher than a height H2 of the semiconductor die 260.

Figure 6:
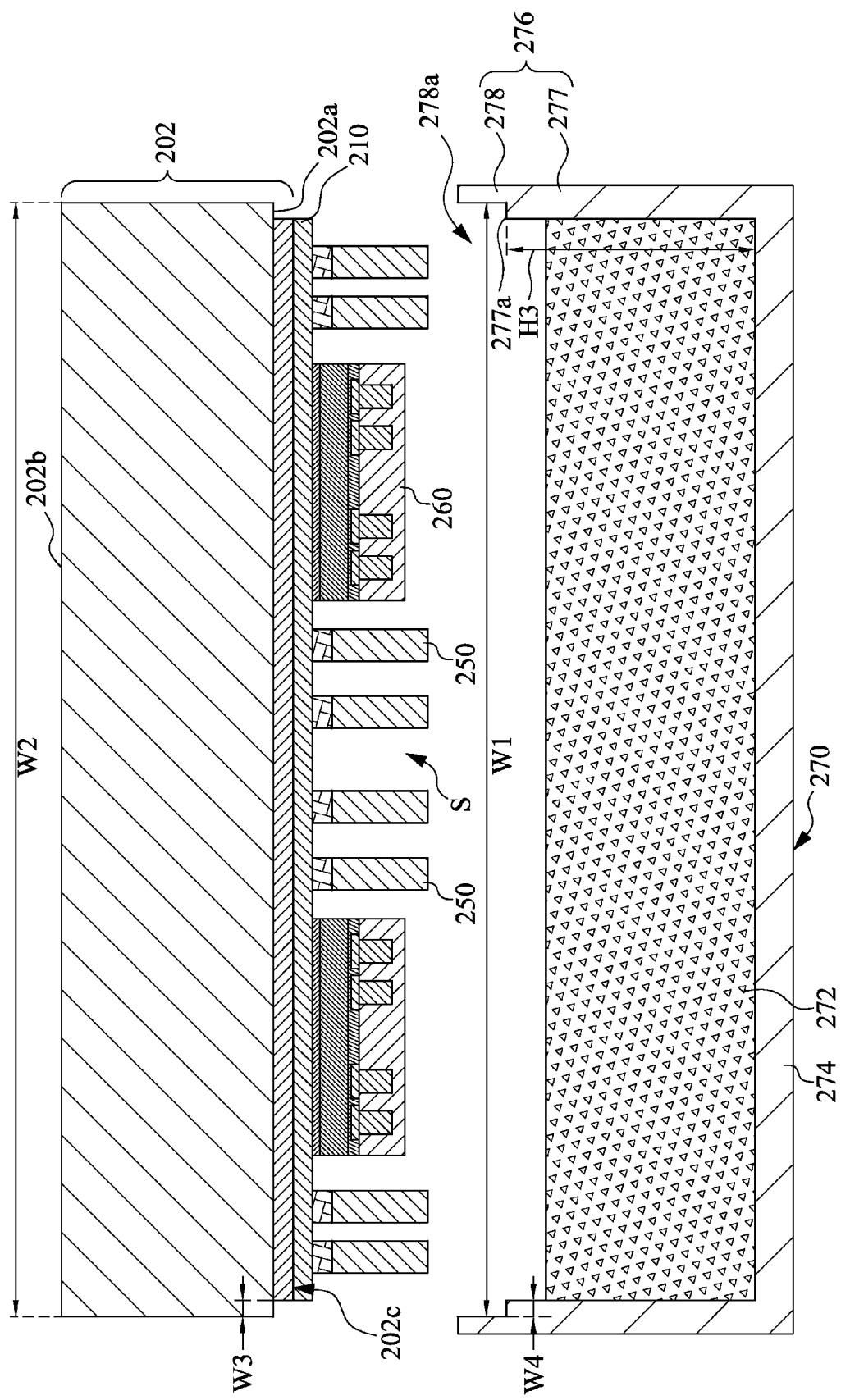

In operation 104, the substrate 202 having the column structures 250 attached thereon is flipped over such that the one or more column structures 250 are beneath the substrate 202, as shown in FIG. 6. In other words, the column structure 250 faces down. In some embodiments, the semiconductor die 260 and the column structures 250 are positioned on the same surface of the carrier substrate 202 so that the semiconductor die 260 as well as the column structures 250 are beneath the substrate 202.

In operation 106, the one or more column structures 250 attached on the flipped substrate 202 are dipped or immersed into a molding material fluid 272 that is contained in a container 270. In various embodiments, the substrate 202 has a number of column structures 250, and the spacing S between the column structures 250 are filled with the molding material fluid 272. In some embodiments, the semiconductor die 260 and the column structures 250 are positioned on the same surface of the carrier substrate 202 so that the column structures 250 and the semiconductor die 260 are concurrently immersed in the molding material fluid 272.

In some embodiments, the operation 106 may include the acts described below. First, the molding material fluid 272 is disposed in the container 270. In addition, the container 270 has a base plate 274 and a sidewall 276 surrounding the base plate 274 configured to contain the molding material fluid 272. Subsequently, the column structures 250 is immersed into the molding material fluid 272 so that molding material fluid 272 flows into the spacing S between the column structures 250, and surrounds the column structures 250 and semiconductor die 260. Furthermore, the molding material fluid 272 contacts the dielectric layer 210 when the column structures 250 are immersed in the molding material fluid 272.

In some examples, the sidewall 276 of the container 270 includes a base segment 277 and a flange 278. The base segment 277 is connected to the base plate 274, and the flange 278 extends upward from the base segment 277. The flange 278 of the sidewall 276 constitutes an inlet 278a of the container 270, in which the inlet 278a faces the substrate 202 when the column structures 250 is immersed in the molding material fluid 272. In some examples, the inlet 278a of the container 270 has a width W1 that is greater than a width W2 of the substrate 202 approximately 0.3-3.0 mm, specifically about 0.5 mm to about 2.0 mm, more specifically about 0.8 mm to about 1.5 mm. It is noted that the base segment 277 has a top surface 277a that is unoccupied by the flange 278. Furthermore, the top surface 277a of the base segment 277 and the flange 278 constitute a step or the like in order to engage the substrate 202. In some examples, the operation 106 includes an act of disposing an edge 202a of the flipped substrate 202 onto the top surface 277a of the base segment 277. Stated differently, the top surface 277a of the base segment 277 is configured to support the flipped substrate 202 when the column structures 250 are immersed in the molding material fluid 272 according to some embodiments of the present disclosure. In yet some examples, the edge 202a of the substrate is free of any de-bounding layer 204 and dielectric layer 210, and the edge 202a has a width W3 of about 0.2-6 mm, specifically about 0.5-5 mm, more specifically about 1-3 mm. In yet some examples, the top surface 277a of the base segment 277 has a width W4 that is greater than the width W3 approximately 0.02-0.8 mm, specifically about 0.1-0.5 mm, more specifically about 0.2-0.4 mm. In yet some examples, the base segment 277 has a height H3 that is greater than a height H1 of the column structures 250 approximately 20-100 µm, specifically about 30 µm to about 70 µm, more specifically about 40 µm to about 60 µm.

The operation 106 may include an act of heating the molding material fluid 272 in the container 270 according to yet some embodiments of the present disclosure. In some embodiments, the flow capability and the viscosity of the molding material fluid 272 may be regulated and controlled by the operation temperature. In some examples, the molding material fluid 272 is heated to a temperature of about 50° C. to about 200° C., specifically about 120° C. to about 180° C., and more specifically about 130° C. to about 160° C., to allow the molding material fluid 272 to fill the spacing S between the column structures 250. In yet some embodiments, the column structures 250 attached on the substrate 202 are immersed in the molding material fluid 272 for a time period of at least 2 minutes, for example about 2 min to about 10 min, specifically about 3 min to about 8 min. In examples, the molding material fluid 272 may include epoxy resin, phenol resin and silica, has a viscosity of about 50 paxs to 150 paxs, specifically about 70 paxs to 110 paxs, at a temperature of about 25° C.

According to yet some embodiments of the present disclosure, the operation 106 may include an act of pressing a back surface 202b of the substrate 202 such that the column structures 250 attached on the substrate 202 are immersed into the molding material fluid 272. In some examples, all column structures 250 are formed on a front side 202c of the substrate 202, and there is no any column structure 250 on the back surface 202b, on which an external force is applied.

Figure 7:
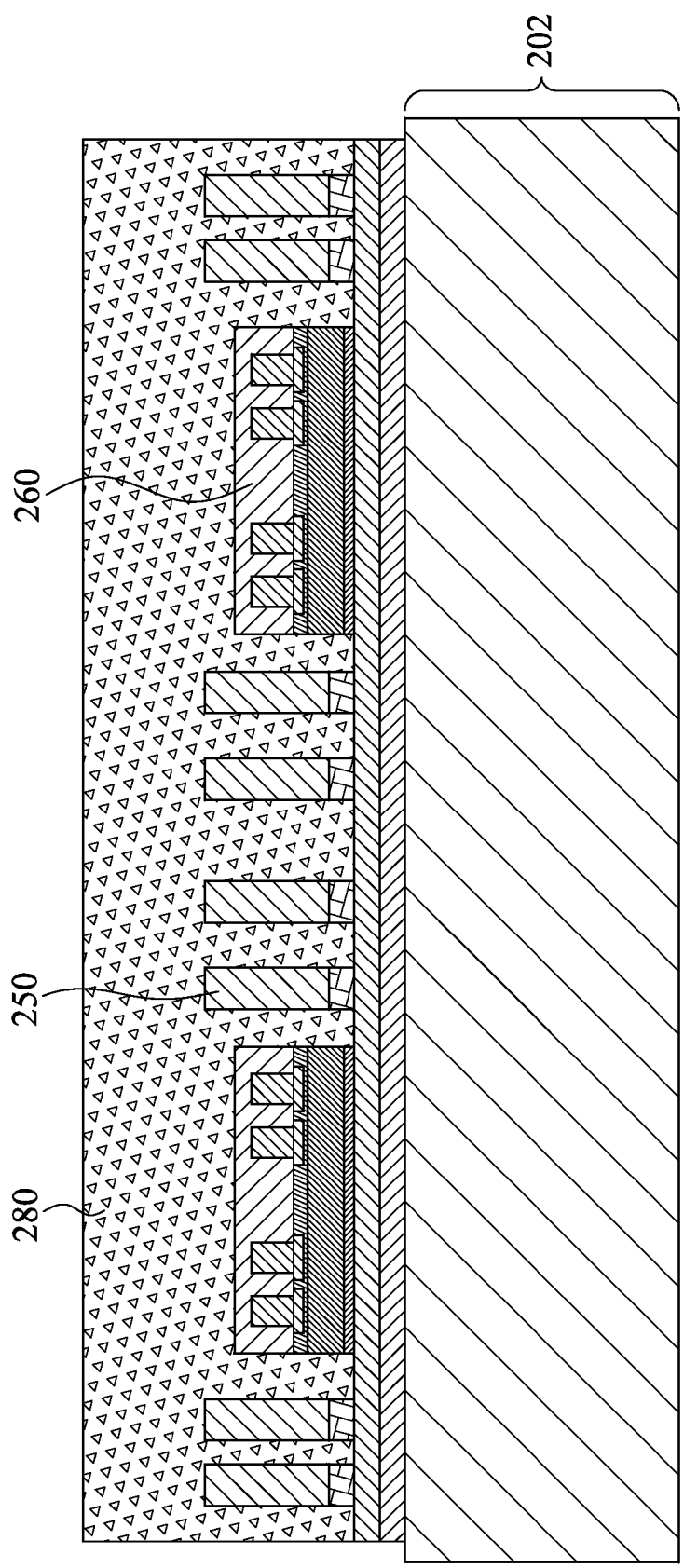

In operation 108, the column structures 250 adhered with molding material fluid 272 is separated from and moved out of the container 270 so as to form a molding layer 280 covering and in contact with the column structures 250, as shown in FIG. 7. In various embodiments, after the operation 108 of moving flipped the substrate 202 with the column structures 250 out of the container 270, the method 100 further includes an act of flipping over the flipped substrate 202 such that the molding layer 280 is positioned above the substrate 202, as shown in FIG. 7. In some embodiments, the semiconductor die 260 and the column structures 250 are positioned on the same surface of the substrate 202, and therefore the molding layer 280 covers and in contact with the column structures 250 and the semiconductor die 260.

The method 100 may include an operation of curing the molding layer 280 after and/or before the operation 108 in accordance with various embodiments of the present disclosure. In some embodiments, when the column structures 250 are dipped in the molding material fluid 272, the molding material fluid 272 is pre-cured in the container 270, and then the pre-cured molding material adhered on the substrate 202 is separated from the container 270. Thereafter, the pre-cured molding material on the substrate 202 is further cured to form a hardened molding layer 280. In yet some embodiments, after the column structures 250 have been dipped in the molding material fluid 272, the molding material fluid 272 is heated to a pre-determined temperature for a sufficient time period such that the molding material fluid 272 is almost harden in the container 270. Thereafter, the substrate 202 with the hardened molding material thereon is separated from the container 270 so to form a hardened molding layer 280 that covers the column structures 250 and the semiconductor die 260. Accordingly, post-curing treatments after the operation 108 may be skipped or omitted in accordance with some embodiments of the present disclosure.

According to various embodiments, the method 100 may optionally include other operations or acts after the operation 108. FIGS. 8-16 are cross-sectional views illustrating operations and/or acts that may be performed after the operation 108.

Figure 8:
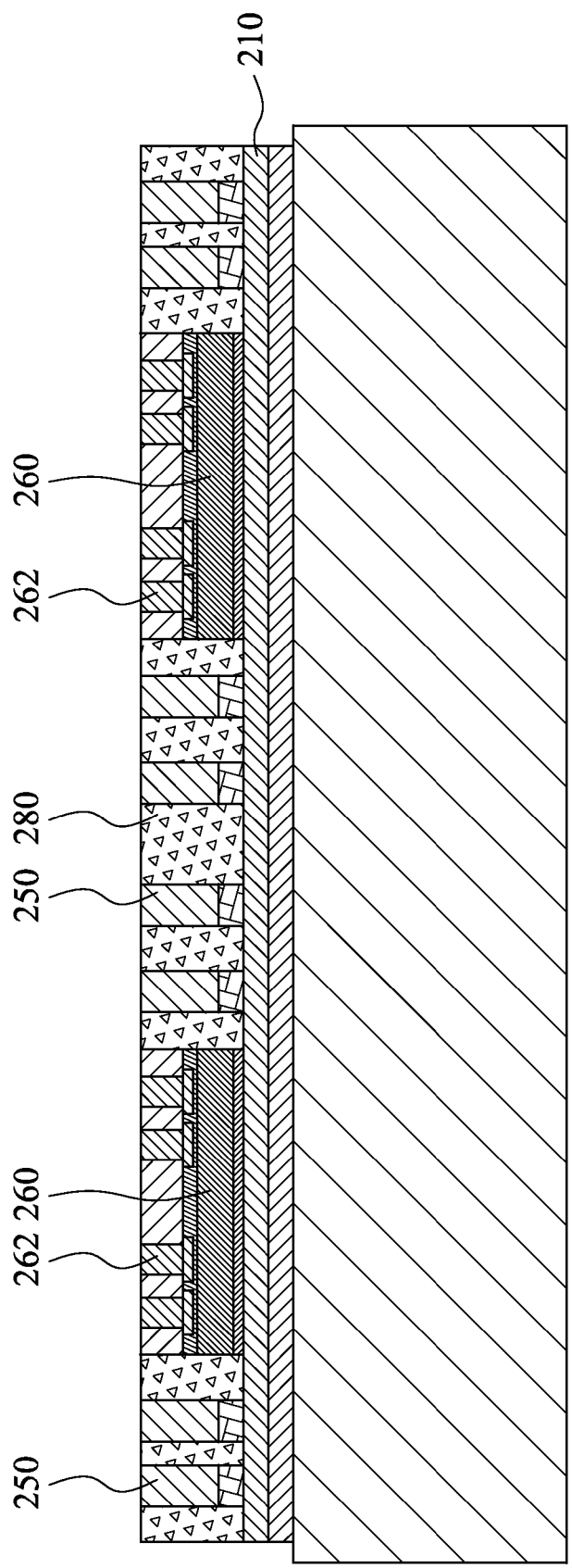

In FIG. 8, the molding layer 280 is thinned or ground to expose the pads 262 of the semiconductor die 260 and the column structures 250. In some embodiments, the column structures 250 and the molding layer 280 are simultaneously ground, and therefore the ground column structures 250 constitute a plurality of through-molding-via (TMV) structures passing through the molding layer 280. The thinned or ground the molding layer 280 has a substantially flat surface opposite to the dielectric layer 210.

Figure 9:
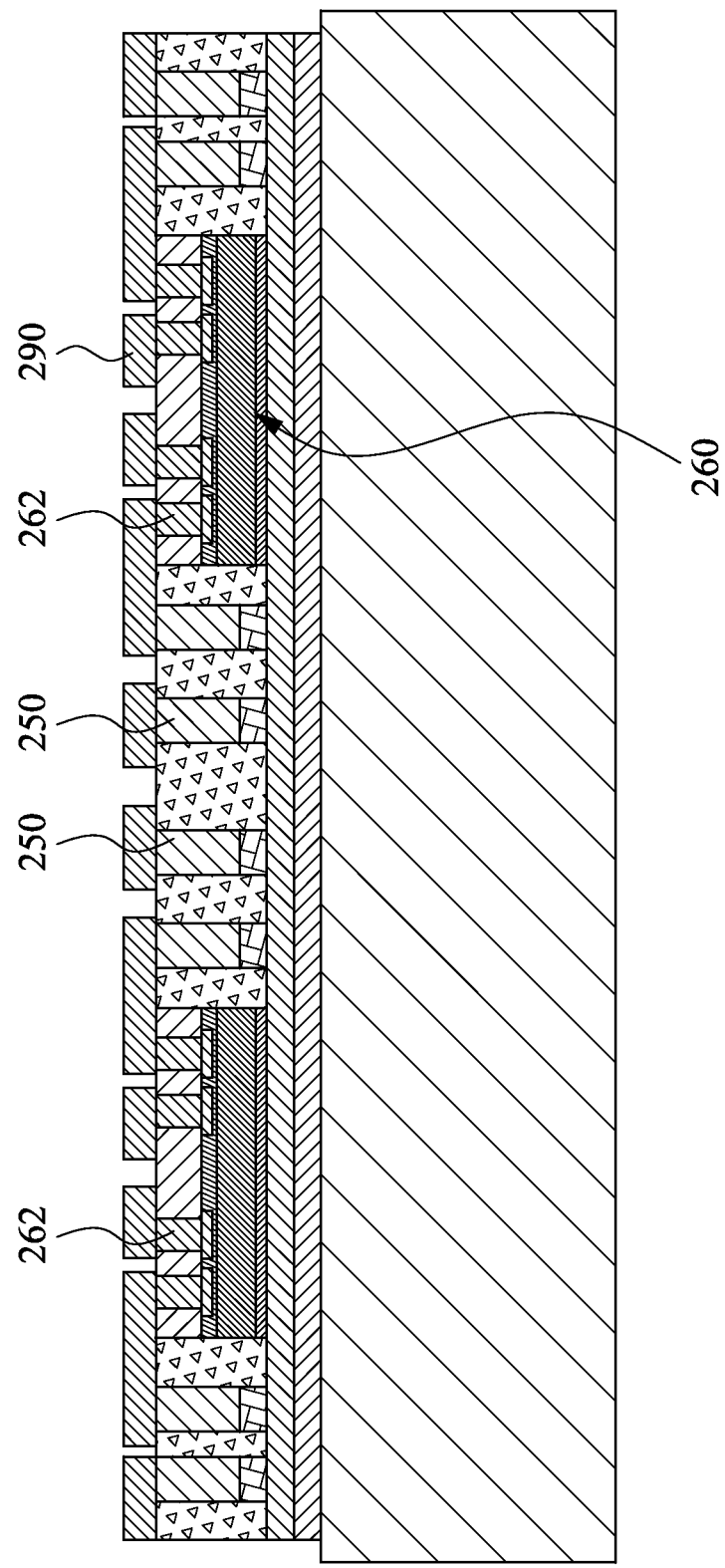

In FIG. 9, a redistribution layer 290 is formed on the column structures 250 and the ground molding layer 280. Furthermore, the redistribution layer 290 connects the column structures 250 with the pads 262 of the semiconductor die 260. In some embodiments, the active devices (not shown) of the semiconductor die 260 are electrically connected to the pads 262, and therefore the active devices of the semiconductor die 260 may be bridged by the redistribution layer 290 and further electrically connected to the column structures 250 (i.e. TMV structures).

Figure 10:
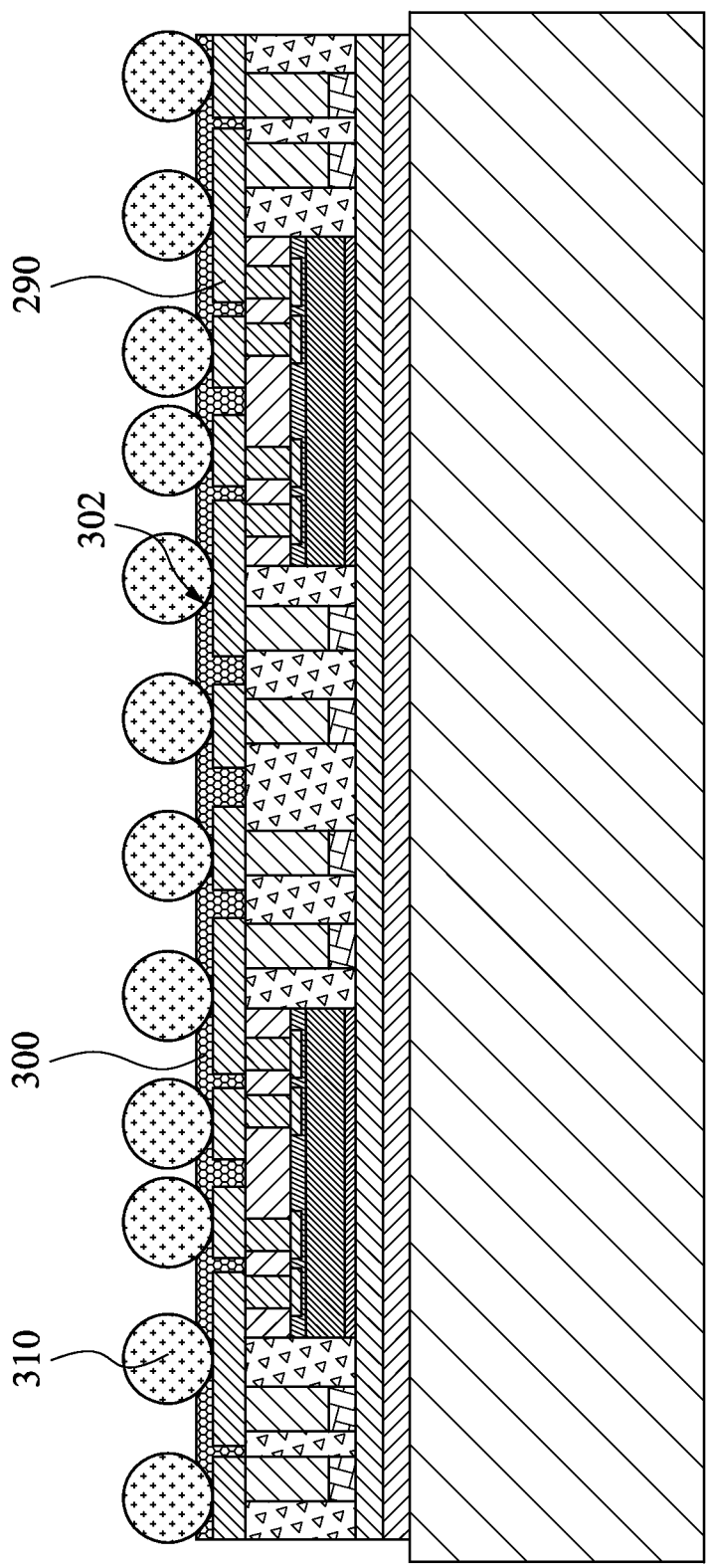

In FIG. 10, a passivation layer 300 and a plurality of conductive bumps 310 are formed over the redistribution layer 290 after the formation of the redistribution layer 290. The passivation layer 300 has a plurality of apertures 302 exposing a portion of the redistribution layer 290. Thereafter, the conductive bumps 310 are formed or mounted on the exposed portion of the redistribution layer 290. The conductive bumps 310 may be a plurality of solder balls or the like, for example. In some embodiments, the solder balls may contain metallic material such as Sn, Ag and Cu, and the like. Alternatively, the conductive bumps 310 may be a plurality of land grid array (LGA) pads configured to be mounted on a print circuit board (PCB). In some embodiments, the conductive bumps 310 are ball grid array (BGA) pads configured to receive other conductive bumps. In some embodiments, the conductive bumps 310 are disposed by electroplating operations or any other suitable operations. A plurality of UBM structures (not shown) may be formed on the redistribution layer 290 at positions aligned with the apertures 302. The UBM structures may help to prevent diffusion between the conductive bumps 310 and the integrated circuits of the semiconductor die, and further provide a low resistance electrical connection between the conductive bumps 310 and the redistribution layer 290. In some examples, the UBM structures may include multiple layers that have an adhesion layer formed of titanium (Ti), chromium (Cr), titanium-tungsten (TiW) or the like, and a wetting layer formed of nickel (Ni), copper (Cu), or the like.

Figure 11:
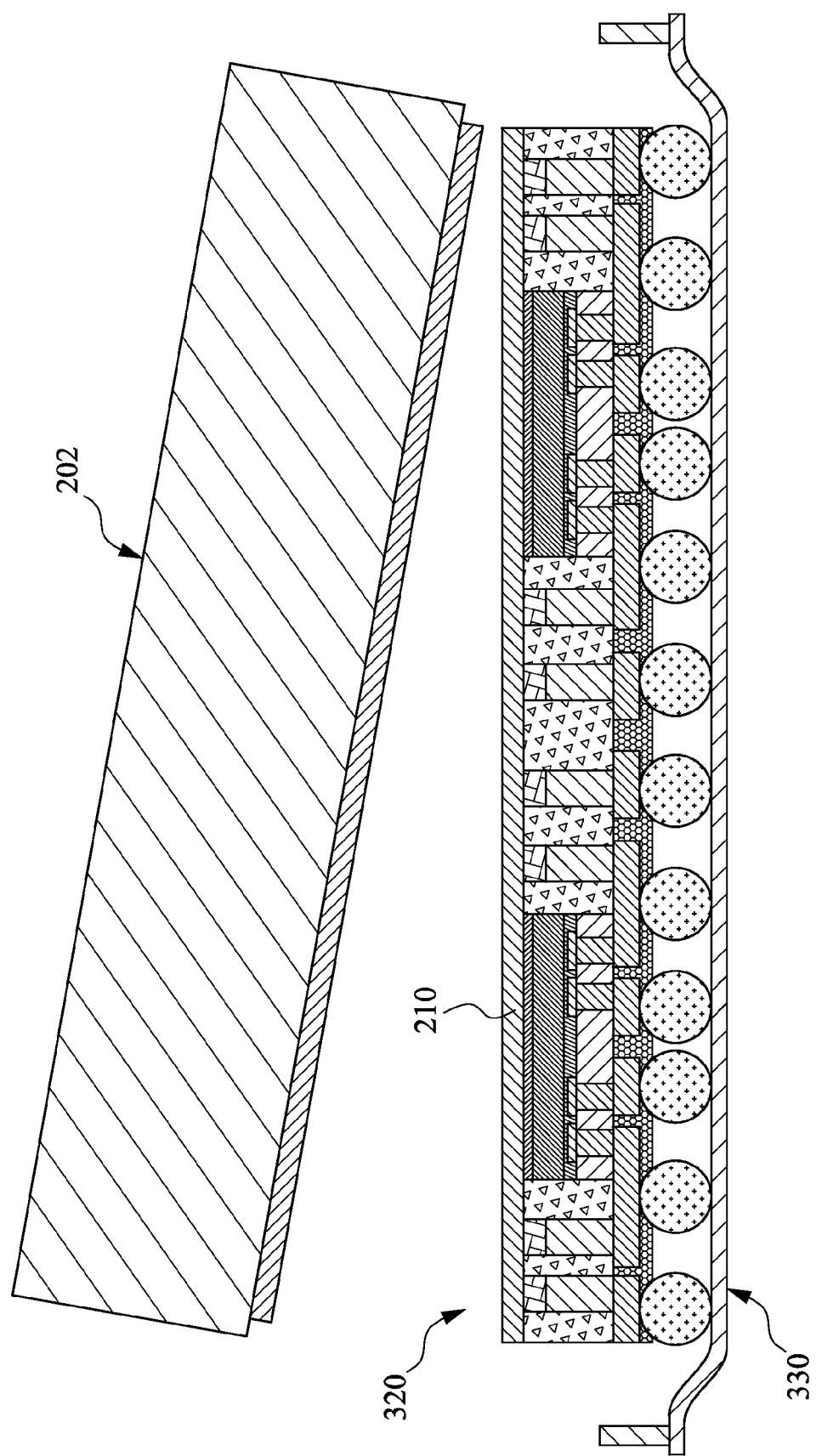

In FIG. 11, the substrate 202 (i.e. carrier substrate 202) is separated or detached from the dielectric layer 210 after the conductive bumps 310 are formed, and thereby obtaining the illustrated package 320. The illustrated package 320 may be used as a bottom package 320 for a package-on-package structure in accordance to some embodiments of the present disclosure. For example, excimer laser techniques or other suitable operations may be employed to detach the substrate 202 from the dielectric layer 210. In some examples, the package 320 is placed on a carrier 330 during and/or after the separation of the substrate 202 d from the dielectric layer 210.

Figure 12:
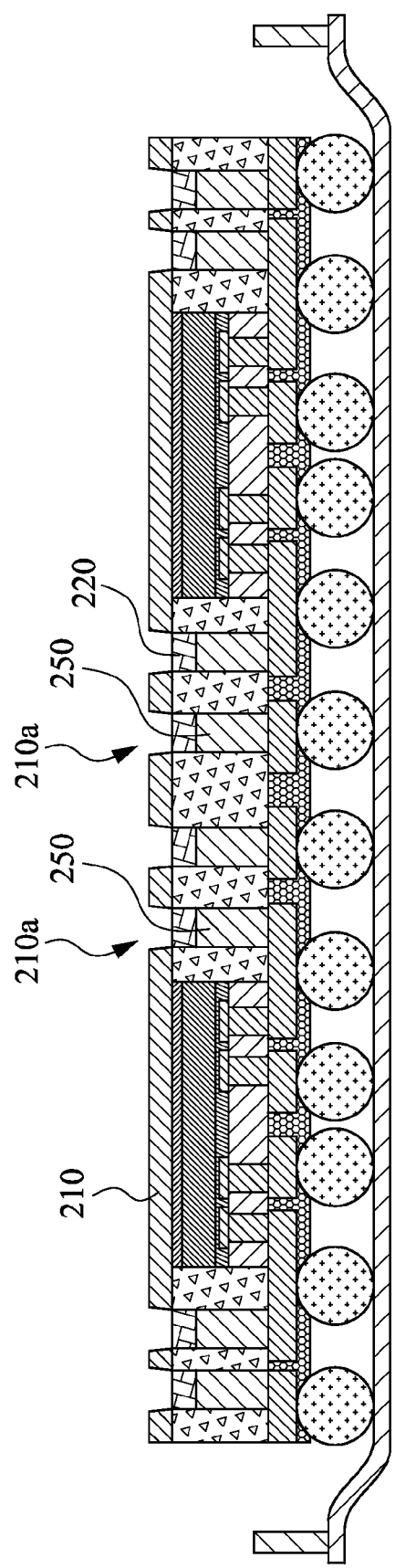

In FIG. 12, a plurality of holes 210a are formed in the dielectric layer 210 at the positions aligned with the column structures 250 after the carrier substrate 202 is separated from the dielectric layer 210. Therefore, the column structures 250 are exposed through the holes 210a. Any suitable approach or operation may be used to form the holes 210a in the dielectric layer 210. For example, photolithographic processes and etching processes may be used to form the holes 210a in the dielectric layer 210. In some embodiments, the remained conductive layer 220 may be removed, and the column structures 250 are exposed.

Figure 13:
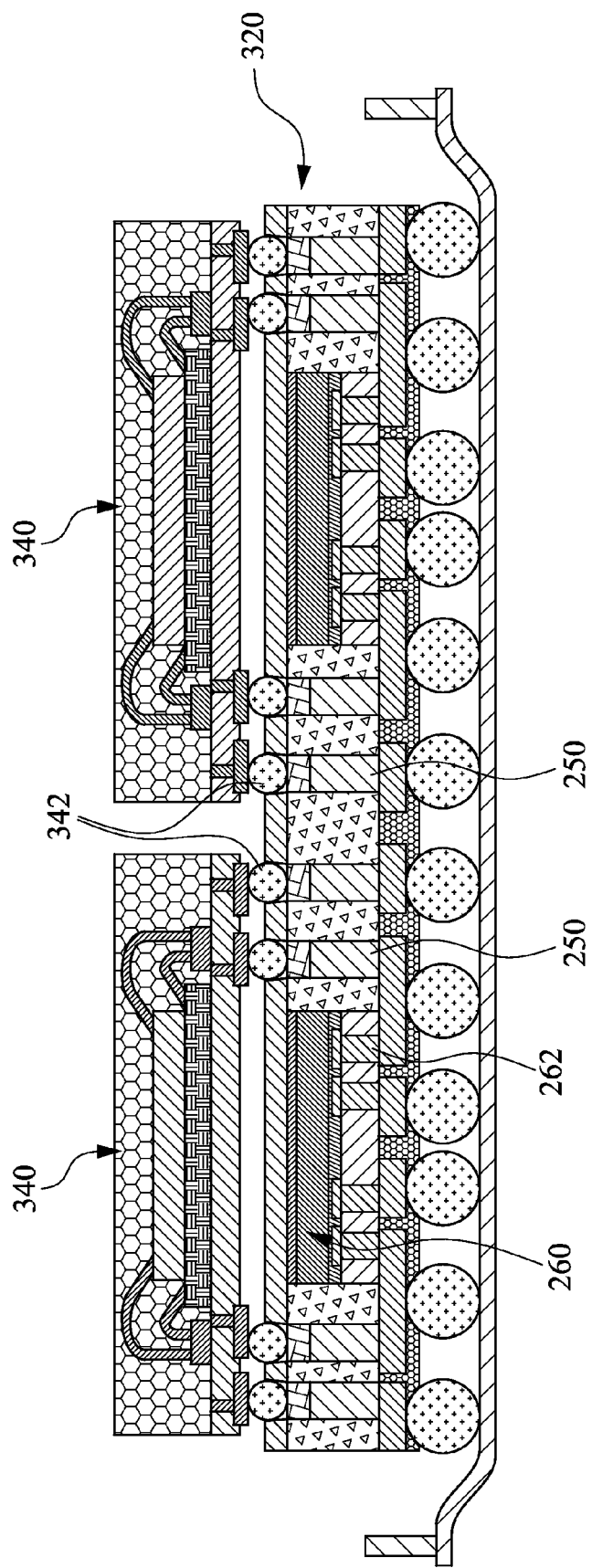

In FIG. 13, one or more semiconductor packages 340 are attached on the bottom package 320 after the formation of the holes 210a in the dielectric layer 210. In some embodiments, each of the semiconductor packages 340 includes a plurality of conductive balls 342 that are aligned with and connected to the column structures 250. Accordingly, the semiconductor die 260 may be electrically connected to the semiconductor packages 340 through the pads 262, the redistribution layer 290 and the column structures 250. In some embodiments, a reflow process may be used to bond the semiconductor packages 340 to the bottom package 320. In some example, the conductive balls 342 may be a ball grid array (BGA) or other bump structures suitable for coupling to the column structures 250. In addition, the semiconductor packages 340 may include memory dies, logic dies, processor dies and/or the like. One of ordinary skill in the art will appreciate that the above examples are provided for illustrative purposes only, and are not meant to limit the present disclosure in any manner.

Figure 14:
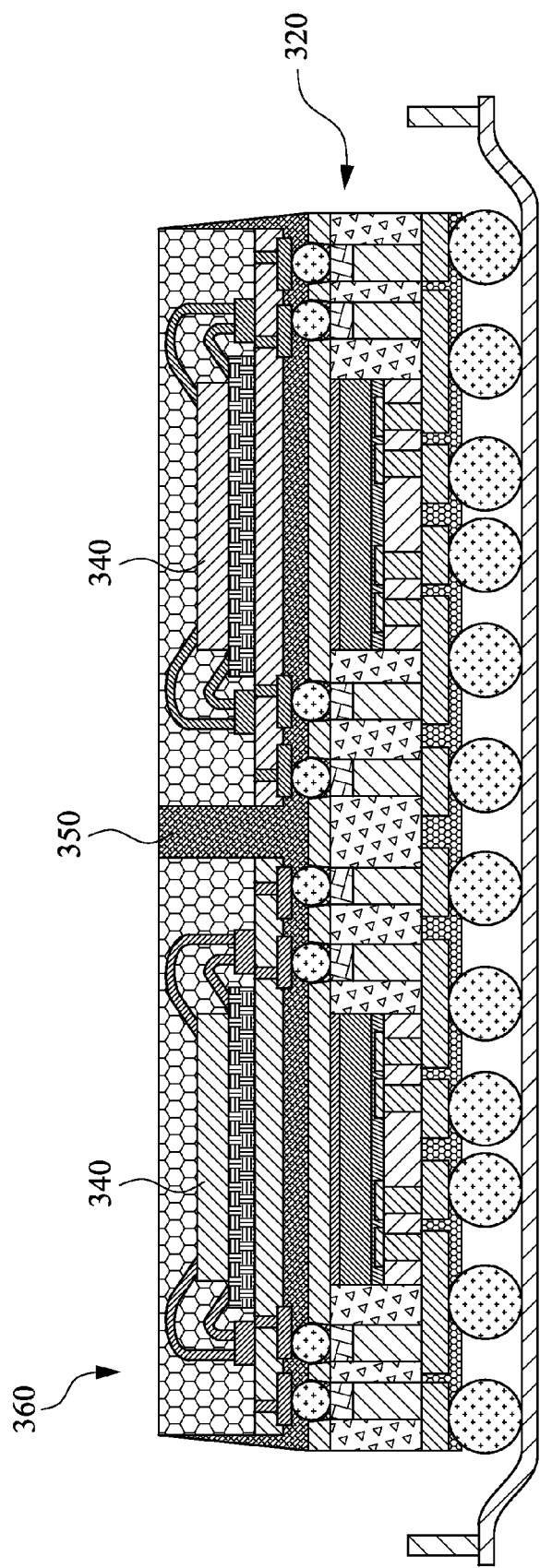

In FIG. 14, an encapsulation material 350 is formed on the bottom package 320 and/or the semiconductor packages 340, and thereby forming a package-on-package structure 360. In accordance with some embodiments, the encapsulation layer 350 may be a molding compound layer formed of suitable underfill materials. The underfill material may fill the gaps between the bottom package 320 and each of the semiconductor packages 340. In some embodiments, the underfill material may include epoxy resin, which is dispensed at the gaps between the packages 320 and 340. The epoxy resin may be provided in a fluid form, and may be hardened after a curing process.

Figure 15:
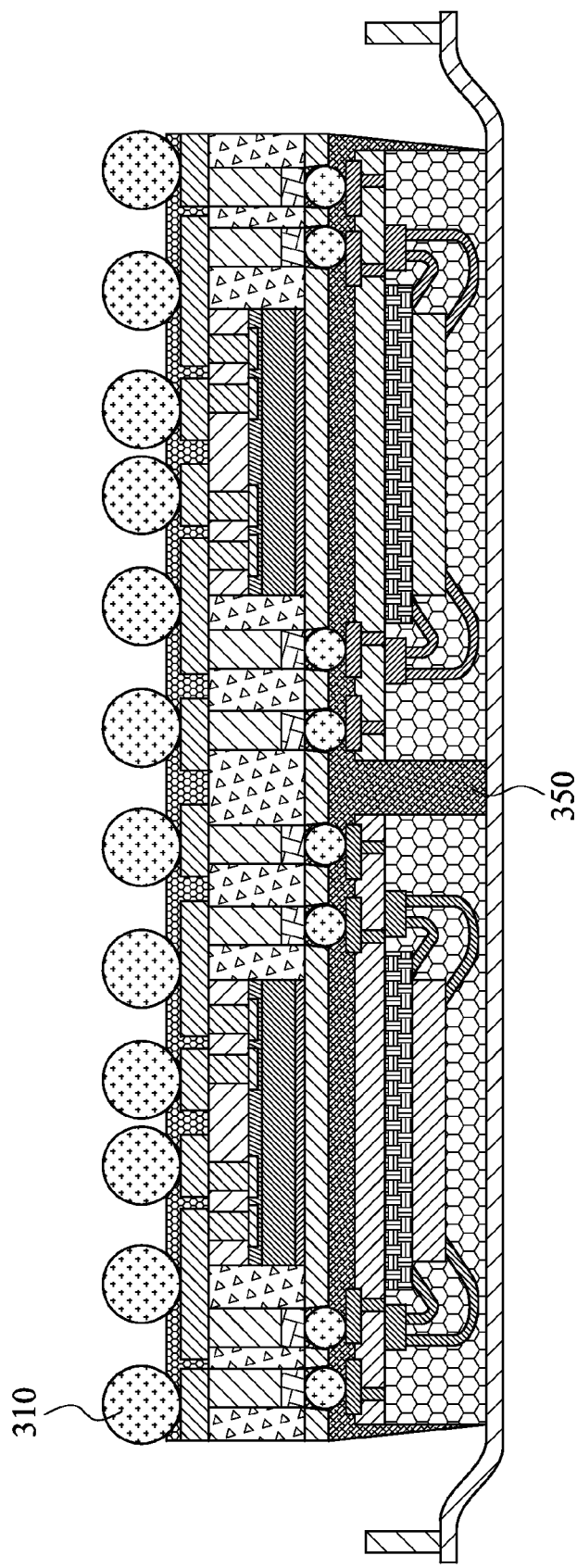
Figure 16:
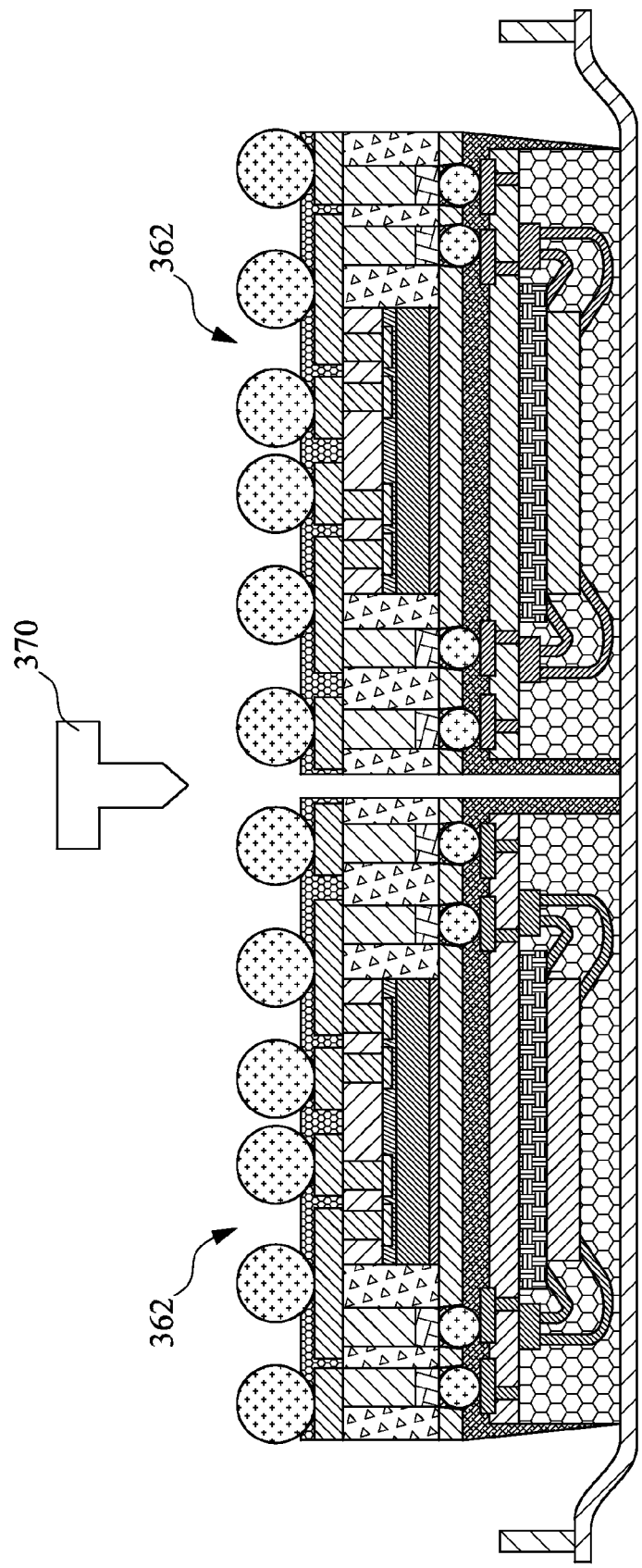

In FIG. 15, the package-on-package structure 360 illustrated in FIG. 14 is flipped over such that the conductive bumps 310 face up and the encapsulation material 350 faces down. In FIG. 16 a singulation process such as for example cutting processes may be carried out to form a number of individual package-on-package devices 362. For instance, the cutting operation may be carried out along the scribe line regions 370. Therefore, a number of pieces of the package-on-package devices 362 are produced. In some embodiments, the obtained package-on-package devices 362 are substantially identical in structure. One of ordinary skill in the art will appreciate that the above examples and/or embodiments illustrated in FIGS. 8-16 are provided for illustrative purposes only to further explain applications of the present disclosure and are not meant to limit the present disclosure in any manner.

Advantages of various embodiments of the present disclosure include providing novel method of forming a molding layer. The novel method may be used to form a molding layer that covers a plurality of via-plugs spaced apart by spacing with a large height/width ratio. Significantly, the molding layer may excellently fills the tiny spacing between the via-plugs, and therefore provides a reliable package structure for semiconductor dies or chips.

In accordance with one aspect of some embodiments, a method of forming a molding layer is provided. The method includes the following operations: (i) forming a substrate having at least one column structure thereon; (ii) flipping over the substrate having the column structure such that the column structure is beneath the substrate; (iii) dipping the column structure of the flipped substrate into a molding material fluid contained in a container; and (iv) separating the column structure of the flipped substrate from the container to form a molding layer covering and in contact with the column structure.

In accordance with another aspect of some embodiments, a method of forming a molding layer is provided. The method includes the following operations: (i) forming a substrate having a plurality of column structures standing thereon; (ii) flipping over the substrate such that the column structures are beneath the substrate; (iii) immersing the column structures of the flipped substrate into a molding material fluid contained in a container such that the molding material fluid fills a spacing between the column structures; (iv) separating the column structures of the flipped substrate from the container to form a molding material layer covering and in contact with the column structures; (v) curing the molding material layer to form a molding layer; and (vi) grinding the molding layer to expose the column structure.

In accordance with another aspect of some embodiments, a method includes the following operations: (i) forming a plurality of column structures on a carrier substrate and disposing a semiconductor die on the carrier substrate, wherein semiconductor die has a plurality of pads thereon; (ii) flipping over the carrier substrate such that the column structures and the semiconductor die are beneath the carrier substrate; and (iii) immersing the column structures and the semiconductor die of the flipped carrier substrate into a molding material fluid contained in a container; (iv) separating the column structures and the semiconductor die of the flipped carrier substrate from the container to form a molding layer covering and in contact with the column structures and the semiconductor die; and (v) grinding the molding layer to expose the pads of the semiconductor die and the column structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a molding layer, the method comprising:
   forming a substrate having at least one column structure thereon;
   flipping over the substrate having the column structure such that the column structure faces down;
   dipping the column structure of the flipped substrate into a molding material fluid contained in a container, wherein dipping the column structure of the substrate into the molding material fluid comprises:
      disposing the molding material fluid into the container, wherein the container has a base plate and a sidewall surrounding the base plate configured to contain the molding material fluid, wherein the sidewall has a base segment and a flange extending upward from the base segment, and the flange constitutes an inlet of the container, and immersing the column structure of the flipped substrate into the molding material fluid; and separating the column structure of the flipped substrate from the container to form a molding layer covering and in contact with the column structure.

2. The method according to claim 1, after separating the column structure of the flipped substrate from the container, further comprising flipping over the flipped substrate and curing the molding layer.

3. The method according to claim 1, wherein
the base segment has a top surface unoccupied by the flange.

4. The method according to claim 3, wherein immersing the column structure of the flipped substrate into the molding material fluid comprises disposing an edge of the flipped substrate on the top surface of the base segment.

5. The method according to claim 3, wherein the base segment has a height that is greater than a height of the column structure of approximately 20-100 μm.

6. The method according to claim 1, wherein the inlet has a width greater than a width of the substrate of approximately 0.3-3 mm.

7. The method according to claim 1, wherein dipping the column structure of the flipped substrate into the molding material fluid comprises heating the molding material fluid.

8. The method according to claim 7, wherein heating the molding material fluid comprises heating the molding material fluid to a temperature of approximately 50-200° C.

9. The method according to claim 1, wherein dipping the column structure of the flipped substrate into the molding material fluid comprises pressing a back surface of the substrate, which is free of the column structure, such that the column structure is immersed into the molding material fluid.

10. The method according to claim 1, wherein the column structure has a height of approximately 30-300 μm.

11. A method of forming a molding layer, the method comprising:

forming a substrate having a plurality of column structures standing thereon;

flipping over the substrate such that the column structures face down;

immersing the column structures of the flipped substrate into a molding material fluid contained in a container such that the molding material fluid fills a spacing between the column structures, wherein the container has a base plate and a sidewall surrounding the base plate, wherein the sidewall comprises a base segment connected to the base plate and a flange extending upward from the base segment, wherein the base segment has a top surface unoccupied by the flange;

separating the column structures of the flipped substrate from the container to form a molding material layer covering and in contact with the column structures;

curing the molding material layer to form a molding layer; and grinding the molding layer to expose the column structures.

12. A method, comprising:

forming a plurality of column structures on a carrier substrate and disposing a semiconductor die on the carrier substrate, wherein the semiconductor die has a plurality of pads thereon, wherein forming the plurality of column structures comprises:

forming a dielectric layer over the carrier substrate;

forming a conductive layer over the dielectric layer;

forming a mask layer having a plurality of openings over the conductive layer;

forming a copper material on the conductive layer and filled in the openings of the mask layer;

removing the mask layer from the conductive layer to expose a portion of the conductive layer; and removing the exposed portion of the conductive layer so to form the column structures;

flipping over the carrier substrate such that the column structures and the semiconductor die are beneath the carrier substrate;

immersing the column structures and the semiconductor die of the flipped carrier substrate into a molding material fluid contained in a container;

separating the column structures and the semiconductor die of the flipped carrier substrate from the container to form a molding layer covering and in contact with the column structures and the semiconductor die; and grinding the molding layer to expose the pads of the semiconductor die and the column structures.

13. The method according to claim 12, wherein after grinding the molding layer, the method further comprises:

forming a redistribution layer on the molding layer, wherein the redistribution layer connects the column structures with the pads.

14. The method according to claim 13, wherein after forming the redistribution layer, the method further comprises:

forming a passivation layer on the redistribution layer, wherein the passivation layer has a plurality of apertures exposing a portion of the redistribution layer; and disposing a plurality of conductive bumps on the exposed portion of the redistribution layer.

15. The method according to claim 14, wherein after disposing a plurality of conductive bumps, the method further comprises:

separating the carrier substrate from the dielectric layer.

16. The method according to claim 15, wherein after separating the carrier substrate from the dielectric layer, the method further comprises:

forming a plurality of holes in the dielectric layer at positions aligned with the column structures to expose the column structures.

17. The method according to claim 16, wherein after forming the holes in the dielectric layer, the method further comprises:

attaching a semiconductor package on the exposed column structures.

* * * * *